(12) United States Patent
Roy

(10) Patent No.: US 6,452,796 B1
(45) Date of Patent: Sep. 17, 2002

(54) LOW FLOW IMPEDANCE VOLTAGE GUARD FOR ELECTRONIC ASSEMBLIES

(75) Inventor: Apurba Roy, Carlsbad, CA (US)

(73) Assignee: di/dt, Inc., Carlsbad, CA (US)

( * ) Notice: Subject to any disclaimer, the term of this patent is extended or adjusted under 35 U.S.C. 154(b) by 0 days.

(21) Appl. No.: 10/000,314

(22) Filed: Oct. 23, 2001

(51) Int. Cl.[7] .................................................. H05H 7/20
(52) U.S. Cl. ........................ 361/690; 361/600; 361/679; 361/715; 361/816; 361/720
(58) Field of Search .................................. 361/600, 631, 361/634, 637–639, 644, 647–650, 652, 673, 688, 690, 694–695, 704, 707, 709–710, 715, 719–720, 816, 831

(56) References Cited

U.S. PATENT DOCUMENTS 4,180,955 A * 1/1980 Krstich ....................... 361/679
6,055,155 A * 4/2000 Von Gutfeld ................ 361/690
6,137,689 A * 10/2000 Schechtel et al. ........... 361/816
6,304,458 B1 * 10/2001 Mendolia ..................... 361/814

* cited by examiner

Primary Examiner—Gregory Thompson
(74) Attorney, Agent, or Firm—Lowenstein Sandler PC

(57) ABSTRACT

In accordance with the invention, an open frame circuit assembly mounted on a planar substrate is provided with a low flow impedance voltage guard. The low impedance guard comprises a lower frame member extending peripherally around the assembly, an apertured top member overlying the assembly and a plurality of spaced apart struts supporting the top member from the frame. The top member and struts have rounded surfaces to preserve streamlines in air flowing over the assembly, and all openings and spacings are sufficiently small to preclude accidental human contact with the assembly.

9 Claims, 5 Drawing Sheets

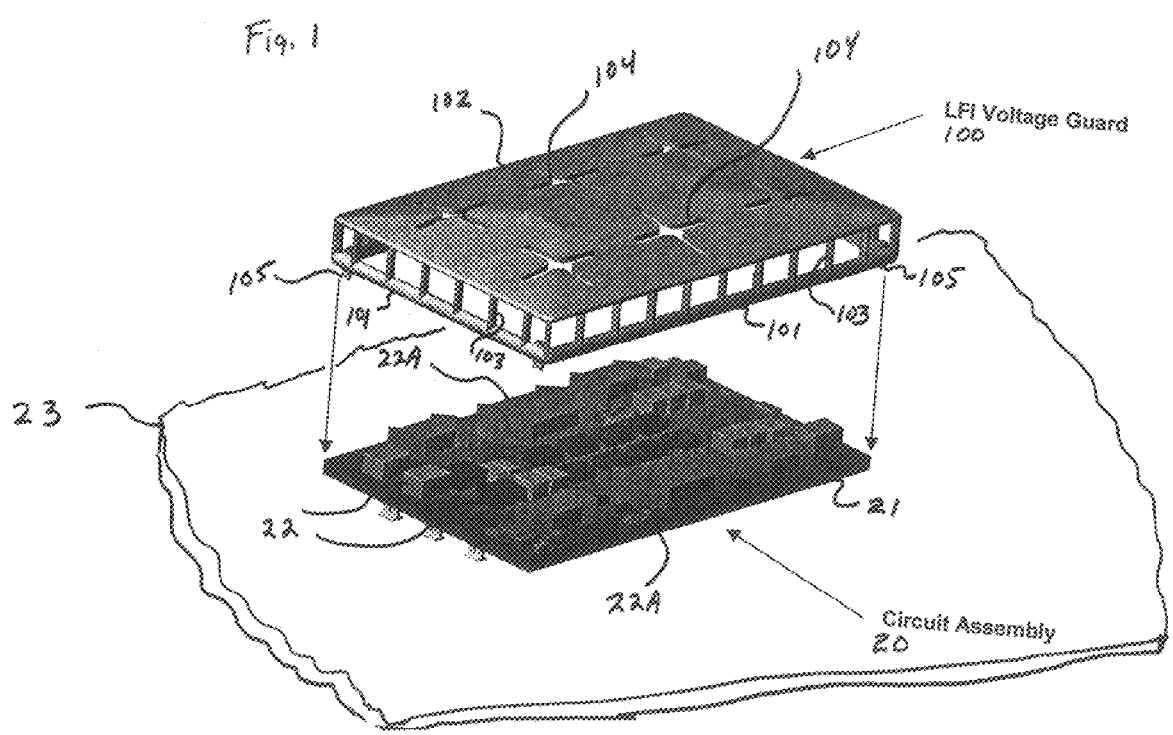

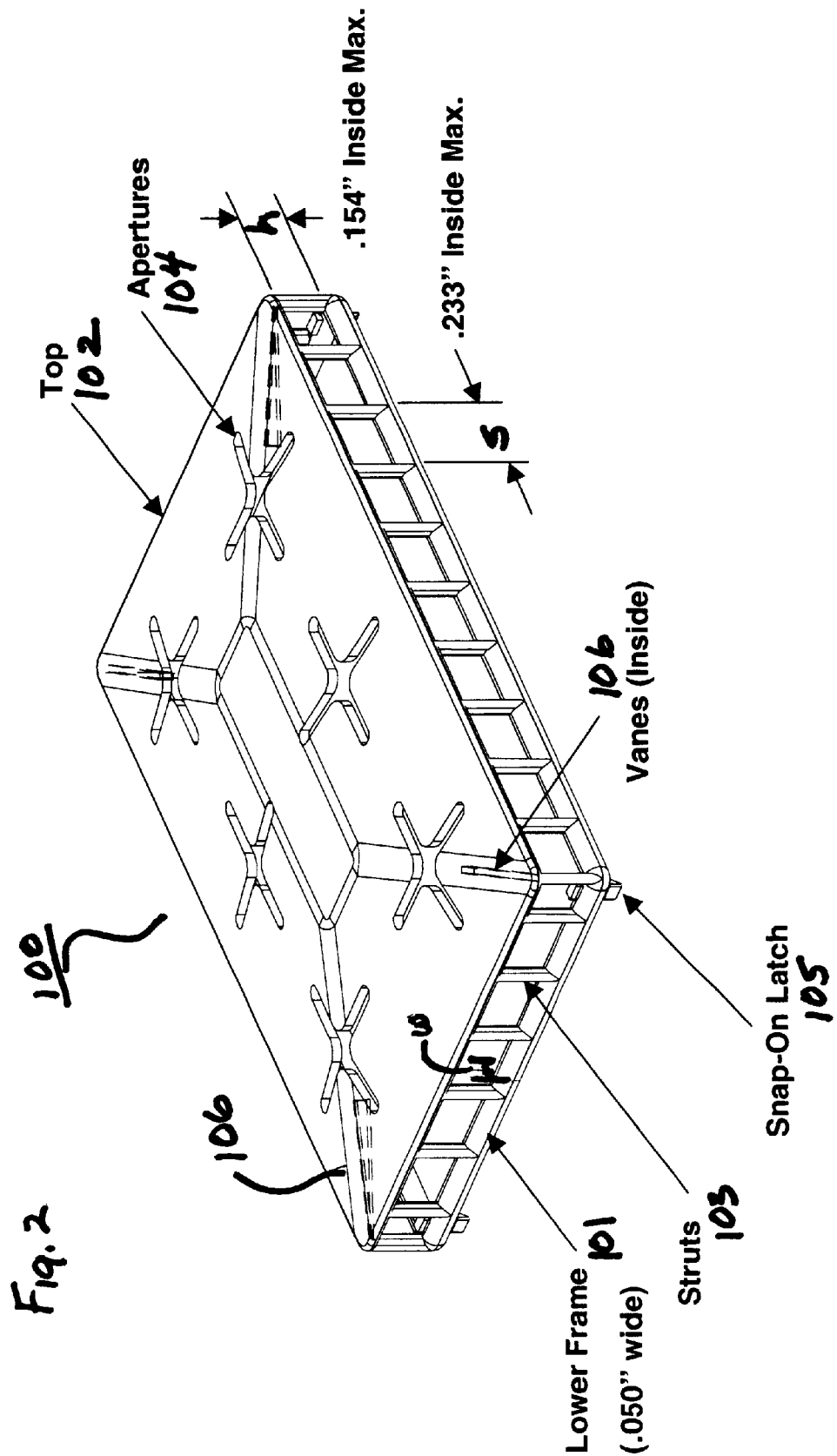

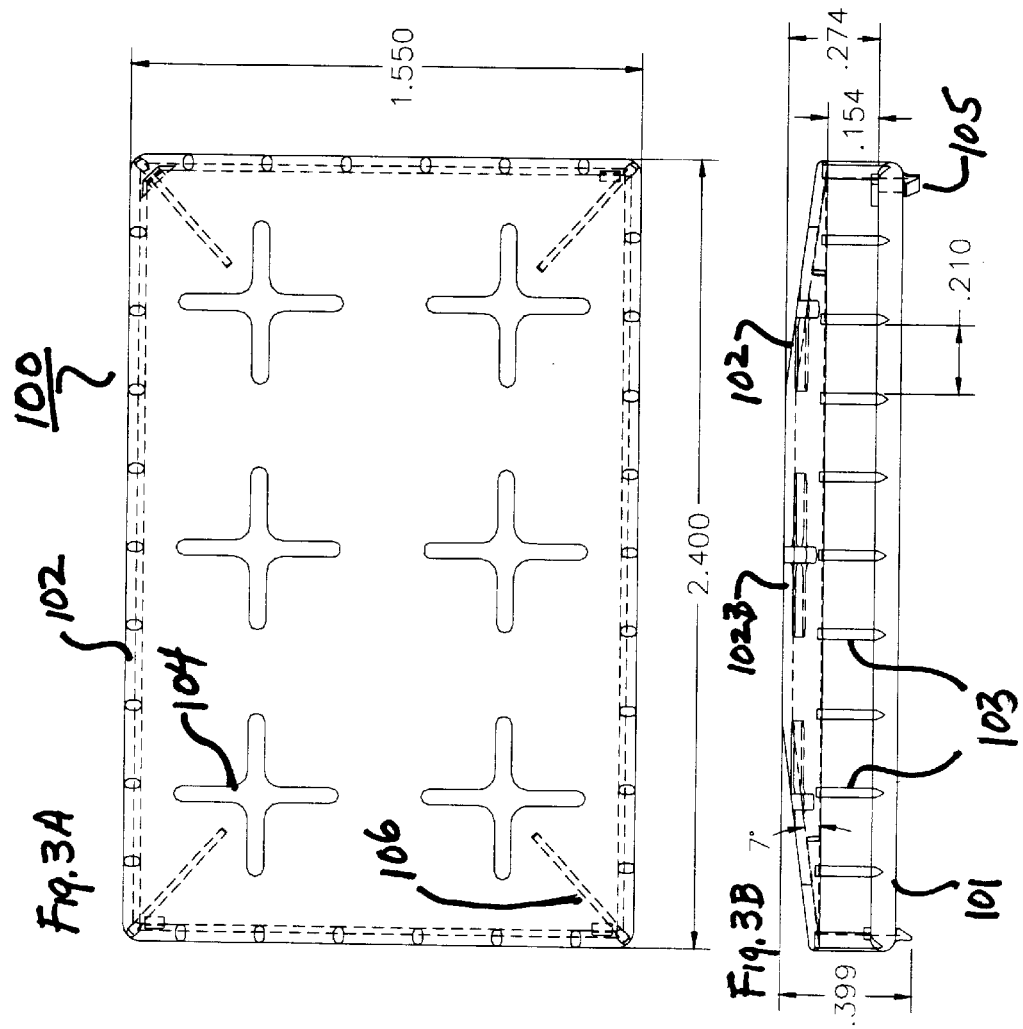

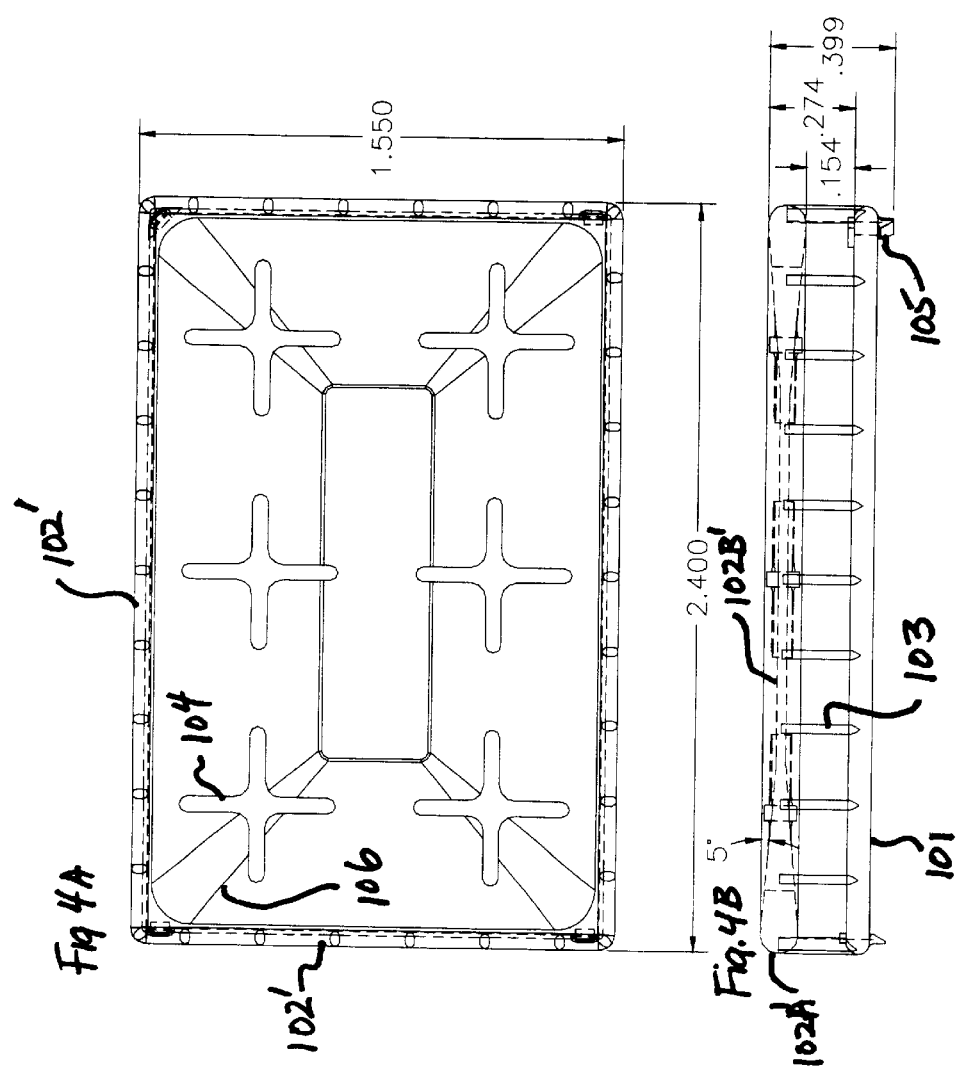

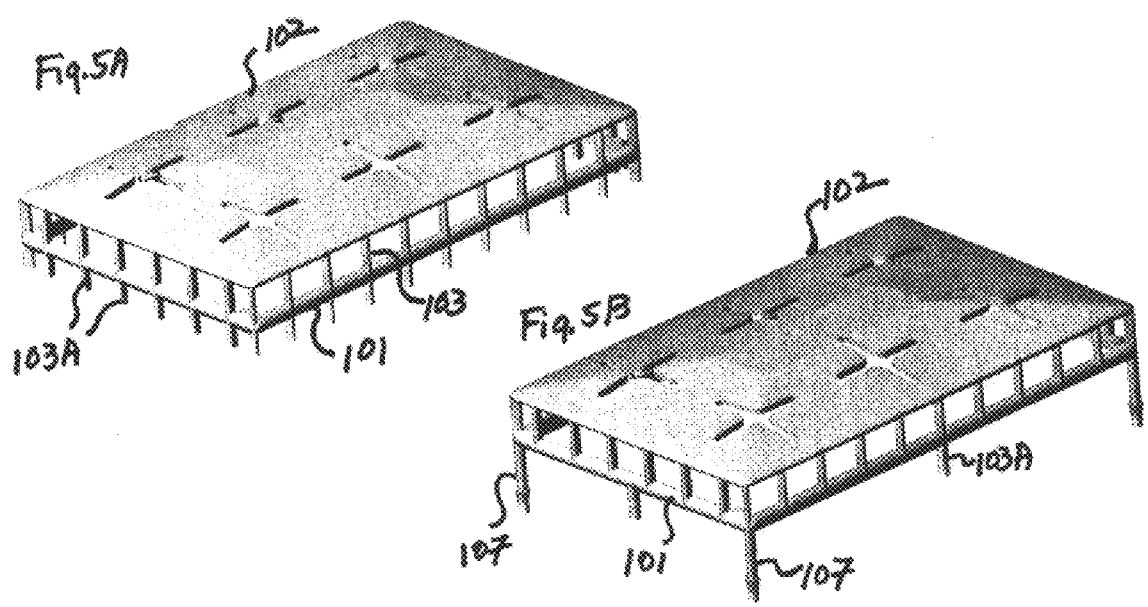

LOW FLOW IMPEDANCE VOLTAGE GUARD FOR ELECTRONIC ASSEMBLIES

FIELD OF THE INVENTION

This invention relates to electronic assemblies and, in particular, to an electronic assembly provided with a low flow impedance voltage guard to protect users from hazardous voltages while facilitating the flow of cooling fluid. The voltage guard can be mounted over the electronic assembly by pick and place techniques.

BACKGROUND OF THE INVENTION

Open frame electronic assemblies, such as modules or circuit cards, are advantageous over closed frame or covered assemblies in many high power applications. In an open frame assembly, heat generating components such as transformers, resistors and transistors are exposed on the surface of the module or card. Consequently when open frame assemblies are placed in operating environments using moving cooling fluid (e.g. air), the fluid moves in direct contact with the heat generating components. The direct contact permits a high rate of heat transfer from the components to the cooling fluid, enabling higher performance of an open frame assembly as compared with a covered assembly. Thus, for example, an open frame power supply will be able to deliver more power for a given rate of airflow than a closed frame power supply.

Unfortunately, in applications involving assemblies with hazardous voltages, service personnel or users may come into proximity with the assemblies. A hazardous voltage has been defined by pertinent standards (EN60950) as any in-circuit AC voltage over 42.2V (peak) or DC voltage over 60V. In such applications open frame assemblies have the disadvantage that human contact can result in a shock hazard. The shock hazard is typically minimized by disposing the circuitry in a closed frame or covered assembly, but the closed frame or cover blocks or greatly reduces airflow, limiting device and circuit performance. Accordingly there is a need for a new type of voltage guard for an electronic assembly which minimizes high voltage hazards while largely preserving the thermal advantages of the open frame assembly.

SUMMARY OF THE INVENTION

In accordance with the invention, an open frame circuit assembly mounted on a planar substrate is provided with a low flow impedance voltage guard. The low impedance guard comprises a lower frame member extending peripherally around the assembly, an apertured top member overlying the assembly and a plurality of spaced apart struts supporting the top member from the frame. The top member and struts have rounded surfaces to preserve streamlines in air flowing over the assembly, and all openings and spacings are sufficiently small to preclude accidental human contact with the assembly.

BRIEF DESCRIPTION OF THE DRAWINGS

The advantages, nature and various additional features of the invention will appear more fully upon consideration of the illustrative embodiments now to be described in detail in connection with the accompanying drawings. In the drawings:

FIG. 1 is a perspective view of a circuit assembly having a low flow impedance voltage guard in accordance with the invention.

FIG. 2 is a perspective view of the voltage guard of FIG. 1;

FIGS. 3A, 3B and 3C are top, side and end views of the voltage guard of FIG. 1;

FIGS. 4A, 4B, and 4C are top, side and end views of an alternative embodiment of the voltage guard; and FIGS. 5A and 5B are perspective views of additional alternative embodiments.

It is to be understood that these drawings are for purposes of illustrating the concepts of the invention and are not necessarily to scale.

DETAILED DESCRIPTION OF THE INVENTION

Referring to the drawings, FIG. 1 is a perspective view of a typical low flow impedance voltage guard 100 for protecting a circuit assembly 20. The circuit assembly 20 typically comprises a planar substrate 21, upon which are mounted a plurality of circuit components 22 which may include high voltage components 22A presenting a voltage hazard to prospective users or service personnel. The assembly 20, in turn, may be mounted on a larger planar system board 23 as part of a larger electronic system.

The low flow impedance voltage guard 100 comprises in essence, a lower frame member 101 extending peripherally around the edges of assembly substrate 21. A top member 102 overlies the assembly 20 and is supported from lower frame 101 by a plurality of spaced apart struts 103. The top member 102 has an aerodynamic shape (concave or convex) and includes one or more apertures 104 to permit heated air to flow from the assembly 20. The apertures 104 are preferably cruciform in shape to prevent human contact with the assembly while providing a relatively large area opening. The exterior and interior edges of the lower frame 101, the top 102 and the struts 103 are advantageously all aerodynamically rounded to promote laminar flow of cooling air and thereby provide low impedance to fluid flow through and over the voltage guard. The terms "aerodynamic shape" and "aerodynamically rounded" as used herein refer to streamlined shapes which preserve streamlines in laminar flow, minimize drag and minimize turbulence in wake. See Raymond Binder, *Fluid Mechanics* $5^{th}$ ed., pp. 45 and 130–131 (Prentice Hall, 1973). Snap on latches 105 can be provided for attaching the guard 100 over and peripherally around the exposed portion of assembly 20. The latches 105 can latch on to the substrate 21. Since circuit assemblies 20 are typically formed on rectangular substrates 21, the voltage guard 100 is advantageously of rectangular form.

Further features and details of the voltage guard 100 can be seen by reference to the partially schematic perspective view of FIG. 2. As can be seen, the top 102 is advantageously reinforced by internal vanes 106 extending from each top corner toward the central portion of the top. The dimensions of the guard 100 are chosen to preclude human contact with the hazardous voltage components and circuitry of assembly 20. (Preclusion of human contact is defined by pertinent regulations (IEC 60950 or UL 1950) as preclusion of contact by a human finger. This can be tested by a model human finger prescribed in JFP 10.) To accomplish this, strut height h and spacing s can be chosen in relation to the width w of the frame, where w is the horizontal dimension of the rounded frame bar cross section. Generally h should be less than about $2\sqrt{w(0.168-w)}$ and s should be less than about $2\sqrt{w(0.322-w)}$, where all dimensions are in inches. For the case where lower frame 101 has a cross sectional width of about 0.050 in., strut height h should be $h \leq 0.154$ in. and spacing s between struts should be s≦0.233 inch. In all cases h should be less than about 0.168" and s should be less than 0.322".

In instances where a greater strut height h is required, a second frame can be formed intermediate the vertical ends of the struts so that the strut height preclusion condition is met. The guard 100 is preferably molded of high temperature, electronically insulating polymer. The polymer should be resistant to temperatures >250° C. for short periods (less than 60 s ) and 100–120° C. for continuous exposure. Preferred polymers are high temperature PCT and PPS polymers or LCP 11, all of which are available from Eastman Chemical Co., Kingsport, Tenn.

FIGS. 3A, 3B and 3C are schematic top, side and end views, respectively, of the voltage guard 100 depicted in FIGS. 1 and 2. The top 102 slopes vertically outwardly to a vertically extended central portion 102B. This provides a convex aerodynamic surface 102B.

FIGS. 4A and 4B are schematic side and end views, respectively, of a voltage guard 100 with an alternative top 102'. As can be seen from these views, the top 102' has rounded edges 102A' and is recessed in the central portion to provide a concave aerodynamic surface 102B'.

FIGS. 5A and 5B are perspective views of alternative voltage guards similar to those described above. In FIG. 5A the struts 103 include portions 103A extending below the lower frame 101 to provide protection against hazardous voltages on the underside of substrate 21. In FIG. 5B, rather than latching onto the circuit assembly substrate 21, the lower frame 101 is provided with snap-in posts 107 that can be inserted into openings in system board 23 around the position for the circuit assembly 20.

It is understood that the above-described embodiments are illustrative of only a few of the many possible specific embodiments, which can represent applications of the invention. Numerous and varied other arrangements can be made by those skilled in the art without departing from the spirit and scope of the invention.

What is claimed is:

1. An electronic assembly including a voltage guard to prevent human contact with hazardous voltages comprising:
   an electronic assembly comprising a substrate and one or more hazardous voltage electronic components mounted on the substrate and
   secured over the assembly a voltage guard comprising a lower frame member extending peripherally around the assembly, a top member having one or more apertures overlying the assembly and a plurality of spaced apart struts supporting the top member from the frame, the dimensions of the one or more apertures, the spacing between the struts and the height of the struts sufficiently small to prevent human contact with the hazardous voltage components and the edges of the struts and frame rounded to minimize impedance to fluid flow through the voltage guard.

2. The assembly of claim 1 wherein the top member has an upper surface shaped to preserve streamlines in fluid flowing over the assembly.

3. The assembly of claim 2 wherein the top member has a concave upper surface with a central region recessed toward the substrate.

4. The assembly of claim 2 wherein the top member has a convex upper surface with a central region displaced away from the substrate.

5. The assembly of claim 1 wherein one or more apertures in the top member have a cruciform shape.

6. The assembly of claim 1 wherein the frame member has a cross sectional width w and the height h of the struts between the frame and the top member is $h \leq 2\sqrt{w(0.168-w)}$, h and w measured in inches.

7. The assembly of claim 1 wherein the frame member has a cross sectional width w and the spacings between successive struts is $s \leq 2\sqrt{w(0.322-w)}$ s and w measured in inches.

8. The assembly of claim 1 wherein the lower frame member is attached to the substrate.

9. An electronic system comprising:
   a generally planar system board;
   an electronic assembly according to claim 1 attached to the system board, the substrate attached to the system board and the lower frame member of the voltage guard attached to the system board around the substrate.

* * * * *